United States Patent [19]

Ahn et al.

[11] Patent Number: 5,712,063
[45] Date of Patent: Jan. 27, 1998

[54] PHASE SHIFT MASK COMPRISING LIGHT SHIELDING REGIONS HAVING A MULTIPLE BOX STRUCTURE

[75] Inventors: Chang Nam Ahn; Young Sik Kim, both of Ichon, Rep. of Korea

[73] Assignee: Hyundai Electronics Industries Co., Ltd., Ichon, Rep. of Korea

[21] Appl. No.: 729,675

[22] Filed: Oct. 3, 1996

[30] Foreign Application Priority Data

Oct. 4, 1995 [KR] Rep. of Korea ............ 95-33880

[51] Int. Cl.⁶ ........................................... G03F 9/00
[52] U.S. Cl. ................... 430/5; 430/322; 430/324
[58] Field of Search ......................... 430/5, 322, 324

[56] References Cited

U.S. PATENT DOCUMENTS

| | | | |
|---|---|---|---|
| 5,246,800 | 9/1993 | Muray | 430/5 |
| 5,370,975 | 12/1994 | Nakatani | 430/325 |

*Primary Examiner*—S. Rosasco
*Attorney, Agent, or Firm*—Gary M. Nath; Nath & Associates

[57] ABSTRACT

A phase shift mask for forming contact holes in the fabrication of highly integrated semiconductor devices. The phase shift mask includes a transparent substrate, a plurality of light exposure regions respectively defined by patterns formed on portions of the transparent substrate corresponding to contact holes which will be formed using the phase shift mask, the patterns including those comprised of a first phase shift film and those comprised of a second phase shift film exhibiting a difference in phase from the first phase shift film. The phase shift mask also includes a plurality of light shield regions respectively defined by patterns formed on portions of the transparent substrate not covered with the patterns defining the light exposure regions. The patterns of the light shield regions include those comprised of the first phase shift film and those comprised of the second phase shift film while the light shield regions each have a double box structure including an inner box and an outer box respectively consisting of the patterns of the first and second phase shift films associated with the light shield region. The patterns of the first and second phase shift films define the light exposure regions and light shield regions are arranged in such a manner that adjacent patterns are different in phase from each other.

19 Claims, 6 Drawing Sheets

PHASE SHIFT MASK COMPRISING LIGHT SHIELDING REGIONS HAVING A MULTIPLE BOX STRUCTURE

BACKGROUND OF THE INVENTION

1. Field of the Invention

The present invention relates to a phase shift mask used in the fabrication of semiconductor devices, and more particularly to a phase shift mask for forming contact holes in the fabrication of highly integrated semiconductor devices.

2. Description of the Prior Art

The recent trend to fabricate highly integrated semiconductor devices results in a reduced distance between adjacent lines, an increased topology and a reduced size of unit elements such as transistors or capacitors. For this reason, the requirement to form patterns with a micro dimension has been increased.

Generally, light exposure masks, which are used in the light exposure process for forming photoresist film patterns, are fabricated by coating a light shield film comprised of a chromium layer or aluminum layer over a quartz substrate, and then etching the light shield film in accordance with an ion beam etching method, thereby forming a light shield film pattern. However, such general light exposure masks have difficulty forming patterns with a micro dimension smaller than the limit of the light resolution of steppers.

Furthermore, conventional photoresist solutions and steppers, for example, G-line steppers with the wavelength of 436 nm or I-line steppers with the wavelength of 365 nm have difficulty forming patterns having a micro dimension of 0.5 μm or less.

In the case of patterns having contact holes, those patterns are formed to have a dimension increased by 10 to 30% as compared to line/space patterns.

On the other hand, semiconductor devices having a high integration degree of the 64 Mega DRAM grade or greater need a micro pattern with a dimension of 0.5 μm or less. In order to form such a micro pattern, phase shift masks capable of forming photoresist film patterns exhibiting a high resolution have been used.

Typically, such phase shift masks have a phase shift film pattern adapted to shift the phase of light through an angle of 180° or 90° along with light shield film patterns so as to uniformly maintain the amplitude of light irradiated onto a wafer in the light exposure process. In other words, such phase shift masks utilizes the principle of minimizing the light exposure effect resulting from the interference between the light passing through the phase shift film pattern and the light passing through a pattern disposed adjacent to the phase shift film pattern, thereby improving the resolution of a photoresist film pattern finally formed.

The phase shift film pattern is made of a phase shift material exhibiting a refractivity of n to have a thickness capable of shifting the phase of light with a wavelength of λ through an angle of 160° to 200° so that the light irradiated onto a photoresist film can exhibit an increased contrast ratio. For example, for G-line or i-line incident light, the phase shift film may have 3,400 to 4,000 Å when it is comprised of a spin-on-glass (SOG) film, oxide film or nitride film.

Where such phase shift masks are used, it is possible to form micro patterns having a dimension of 0.5 μm or less using conventional photoresist solution and steppers. Where contact holes are formed using such phase shift masks, their dimension can be reduced as compared to the case when general light exposure masks are used.

However, conventional phase shift masks are a limited in reducing the interval between adjacent contact holes. As a result, they are impractical for the fabrication of highly integrated semiconductor devices.

SUMMARY OF THE INVENTION

Therefore, an object of the invention is to solve the abovementioned problems involved in the prior art and to provide a phase shift mask capable of reducing the interval between adjacent contacts, so that it can be appropriately used in the fabrication of highly integrated semiconductor devices.

In accordance with one aspect of the present invention, a phase shift mask comprises a transparent substrate; a plurality of light exposure regions respectively defined by patterns formed on portions of the transparent substrate corresponding to contact holes which will be formed using the phase shift mask, the patterns including those comprised of a first phase shift film and those comprised of a second phase shift film exhibiting a difference in phase from the first phase shift film; a plurality of light shield regions respectively defined by patterns formed on portions of the transparent substrate not covered with the patterns defining the light exposure regions, the patterns of the light shield regions including those comprised of the first phase shift film and those comprised of the second phase shift film while the light shield regions each having a multiple box structure including at least two concentric boxes respectively consisting of the patterns of the first and second phase shift films associated with the light shield region; and the patterns of the first and second phase shift films defining the light exposure regions and light shield regions being arranged in such a manner that adjacent patterns are different in phase from each other.

In accordance with another aspect of the present invention, a phase shift mask comprises a transparent substrate; a plurality of light exposure regions respectively defined by patterns formed on portions of the transparent substrate corresponding to contact holes which will be formed using the phase shift mask, the patterns including those comprised of a first phase shift film and those comprised of a second phase shift film exhibiting a difference in phase from the first phase shift film; a plurality of light shield regions respectively defined by patterns formed on portions of the transparent substrate not covered with the patterns defining the light exposure regions, the patterns of the light shield regions including those comprised of the first phase shift film and those comprised of the second phase shift film while the light shield regions each having a double box structure including an inner box and an outer box respectively consisting of the patterns of the first and second phase shift films associated with the light shield region; and the patterns of the first and second phase shift films defining the light exposure regions and light shield regions being arranged in such a manner that adjacent patterns are different in phase from each other.

In accordance with another aspect of the present invention, a phase shift mask comprises a transparent substrate; a plurality of light exposure regions respectively defined by patterns formed on portions of the transparent substrate corresponding to contact holes which will be formed using the phase shift mask, the patterns including those comprised of a first phase shift film and those comprised of a second phase shift film exhibiting a difference in phase from the first phase shift film; a plurality of light shield regions respectively defined by patterns formed on portions of the transparent substrate not covered with the patterns defining the light exposure regions, the patterns of the light shield regions including those comprised of the first phase shift film and those comprised of the second phase shift film while the light shield regions each having a triple box structure including three concentric boxes respectively consisting of the patterns of the first and second phase shift films associated with the light shield region and arranged in an alternating manner; and the patterns of the first and second phase shift films defining the light exposure regions and light shield regions being arranged in such a manner that adjacent patterns are different in phase from each other.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
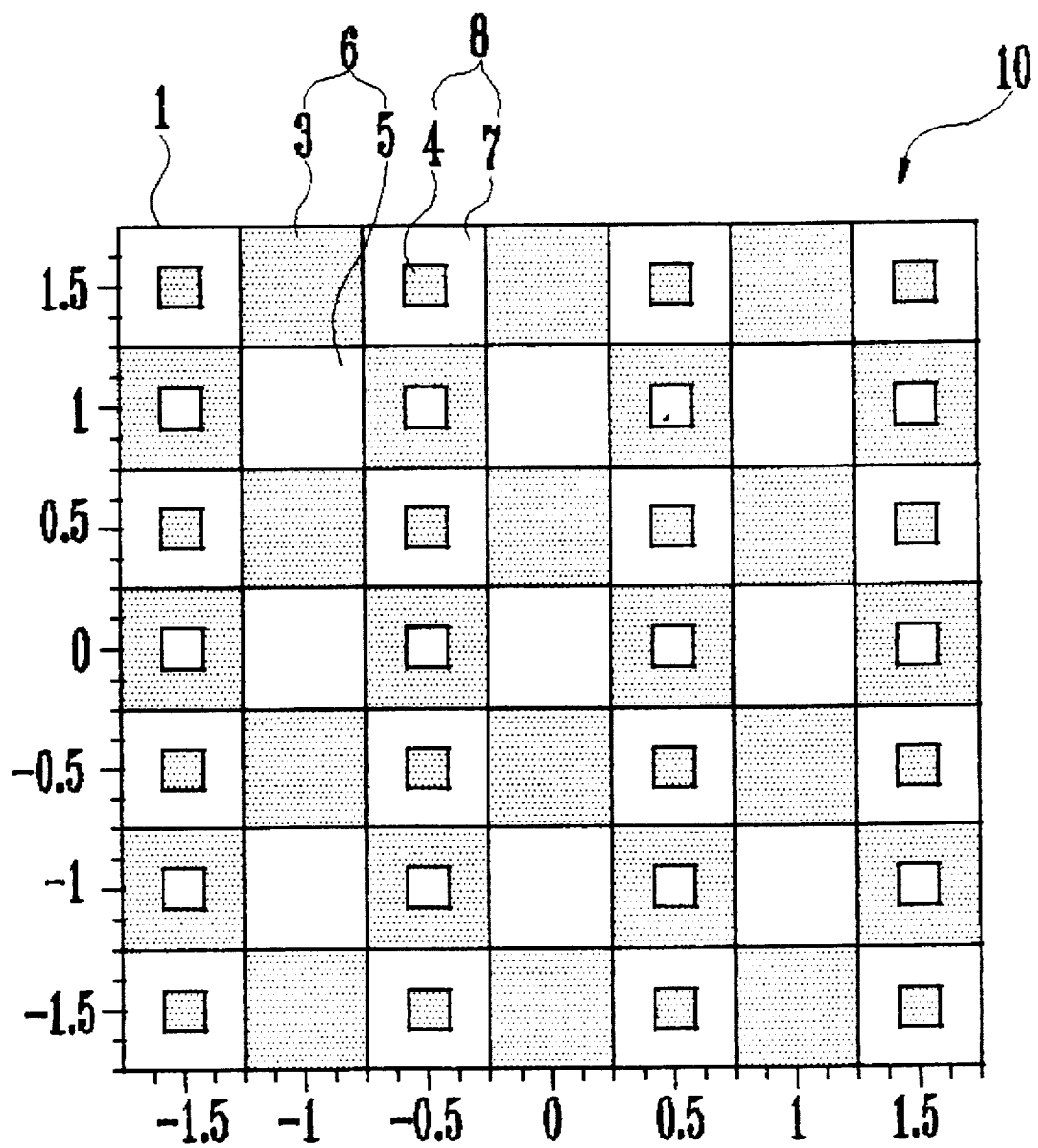
FIG. 1 is a plan view illustrating a phase shift mask according to a first embodiment of the present invention, which is adapted to form contact holes for charge storage electrodes.

FIG. 1 is a plan view illustrating a phase shift mask according to a first embodiment of the present invention, which is adapted to form contact holes for charge storage electrodes.

Referring to FIG. 1, the phase shift mask, which is denoted by the reference numeral 10, includes a transparent substrate 1 made of quartz or glass. As shown in FIG. 1, the transparent substrate 1 is partitioned into a plurality of square unit regions arranged in a matrix array to define light exposure regions 6 and light shield regions 8. In the illustrated case, the light exposure regions 6 and light shield regions 8 are arranged in alternating columns of the matrix array, respectively. The light exposure regions 6 correspond to contact holes for charge storage electrodes of a semiconductor device, respectively.

The phase shift mask also includes patterns 3 of a first phase shift film and patterns 5 of a second phase shift film respectively formed on portions of the transparent substrate 1 corresponding to the light exposure regions 6. The patterns 3 and 5 of the first and second phase shift film patterns have a square shape and define the light exposure regions 6, respectively. Light passing through the first phase shift film exhibits a phase shifted from that of light passing through the second phase shift film.

As shown in FIG. 1, the patterns 3 and 5 defining the light exposure regions 6 are arranged on each light exposure region column in an alternating manner.

The phase shift mask also includes square patterns 4 of the first phase shift film and square patterns 7 of the second phase shift film to define the light shield regions 8. In each light shield region 8, one pattern 4 and one pattern 7 are arranged in such a manner that they form a double box structure including two concentric boxes respectively consisting of those patterns. On each light shield region column, light shield regions each having an inner box consisting of the pattern 4 and an outer box consisting of the pattern 7 and light shield regions each having an inner box consisting of the pattern 7 and an outer box consisting of the pattern 4 are arranged in an alternating manner. Accordingly, adjacent patterns on each light shield region column exhibit a phase shift from each other, respectively.

In accordance with the present invention, the arrangement of patterns 3, 4, 5 and 7 in the matrix array is also carried out in such a manner that those of different phases are arranged adjacent to each other. In other words, patterns of different phases are arranged in each light exposure region 6 and each light shield region 8 adjacent to the light exposure region 6 on each row of the matrix array, respectively.

In accordance with the above-mentioned structure, light beams respectively transmitting adjacent patterns interfere with each other at adjacent portions of those patterns. As a result, contact holes are formed in respective central portions of the light exposure regions 6 defined by the alternating square patterns 3 and 5 of the first and second phase shift materials.

At this time, each light shield region 8 defined by the double box-shaped patterns 4 and 7 of the first and second phase shift materials correspond to the area between adjacent contact holes.

A light shield effect is more or less exhibited between adjacent light exposure region 6 and light shield region 8 because patterns of different phases are arranged adjacent to each other.

In the light exposure mask 10 for forming contacts for charge storage electrodes, each light exposure region 6 permitting light from a light source as used to transmit through the light exposure mask 10 should have a dimension larger than the wavelength of the transmitting light.

On the other hand, each light shield region 8 serving to shield light entering the light exposure mask 10 should have a dimension smaller than the wavelength of the incident light. The dimension of each light shield region 8 corresponds to the distance between the smaller and larger boxes in the double box structure.

Accordingly, the ratio between intervals of contact holes in lateral and longitudinal directions is 1 µm:0.5 µm in this case because the ratio between intervals of contact holes for charge storage electrodes in lateral and longitudinal directions is 2:1.

Figure 2:
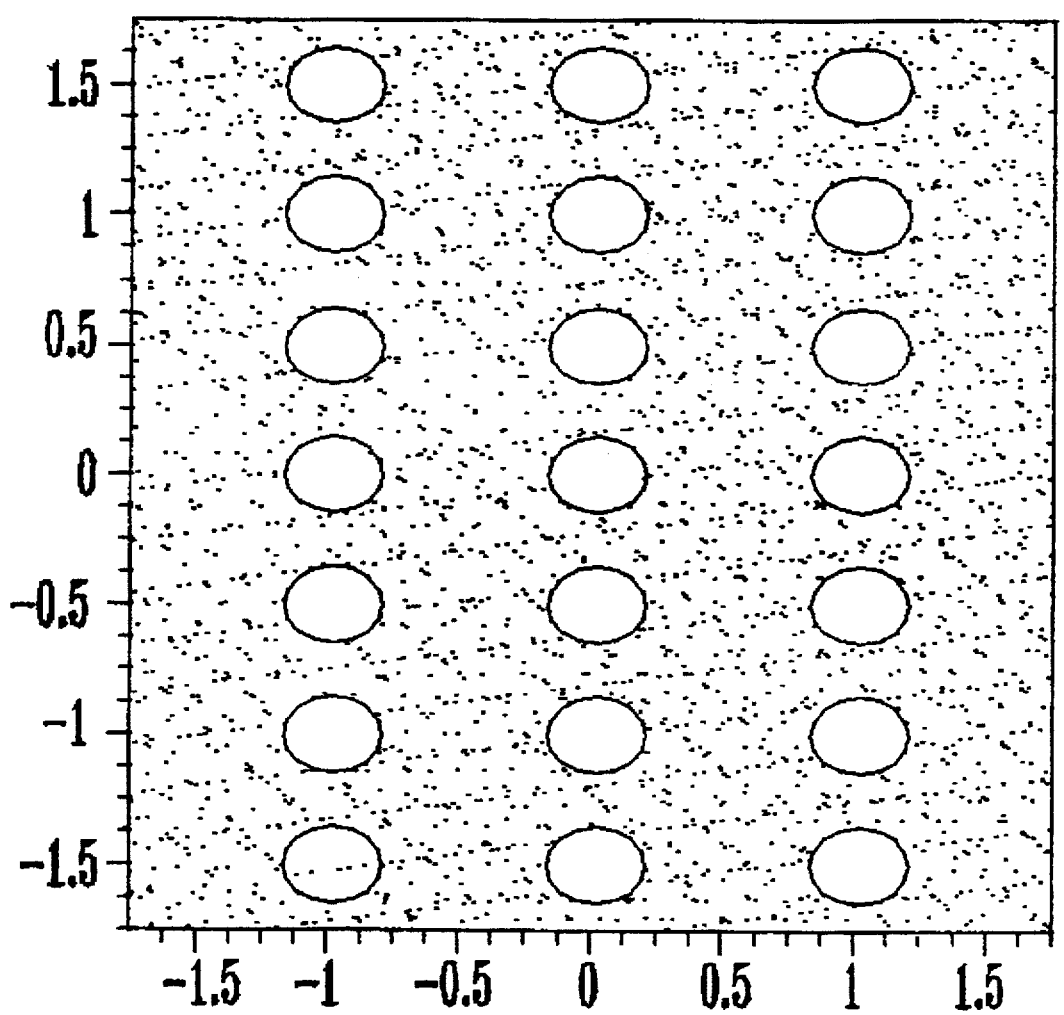
FIG. 2 is a diagram of a light contrast distribution obtained in the light exposure using the phase shift mask of FIG. 1.

As a result, it is possible to obtain a light contrast large enough to indicate the region corresponding to each contact hole in the form of a light circle as shown in FIG. 2.

Where the light exposure mask 10 has a stepping ratio of 1:1, the inner, smaller box of the double box structure is formed to have a size of 0.2×0.2 µm$^2$ using i-line light ($\lambda$=365 nm) when the interval of contact holes is 0:5 µm.

When the interval of contact holes is 0.6 µm, the inner, smaller box of the double box structure is formed to have a size of 0.3×0.3 µm$^2$.

Where KrF laser beams ($\lambda$=248 nm) are used as source light, instead of i-line light, the same contact hole patterns as in the above case can be obtained by increasing the above-mentioned size by about 248/365 time.

The first and second phase shift films providing the patterns 3, 4, 5 and 7 are comprised of a phase shift material such as oxide, nitride or SOG. These patterns are adjusted in thickness and material so that transmitting light can shift in phase.

The patterns 3, 4, 5 and 7 may be formed by etching the substrate to desired depths, respectively.

Where contacts having a pitch different from that of the above-mentioned contact holes for charge storage electrodes are formed, the formation thereof can mask achieved using a phase shift mask in which phase shift film patterns having a double box structure are arranged on portions of a substrate corresponding to light shield regions, respectively.

Figure 3:
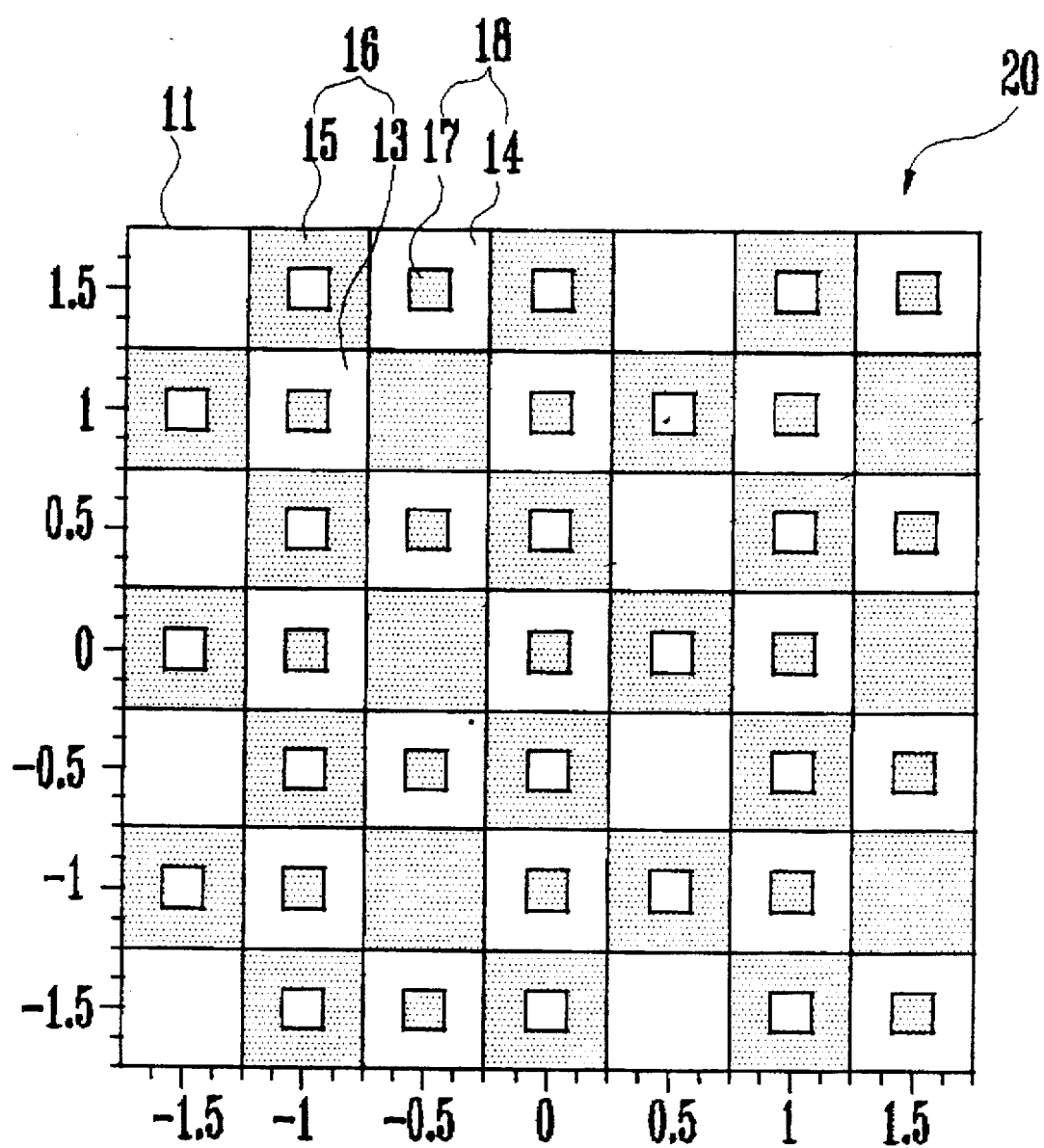
FIG. 3 is a plan view illustrating a phase shift mask according to a second embodiment of the present invention, which is adapted to form contacts for bit lines.

FIG. 3 is a plan view illustrating a phase shift mask according to a second embodiment of the present invention, which is adapted to form contacts for bit lines.

Referring to FIG. 3, the phase shift mask, which is denoted by the reference numeral 20, includes a transparent substrate 11. As shown in FIG. 3, the transparent substrate 11 is partitioned into a plurality of square unit regions arranged in a matrix array to define light exposure regions 16 and light shield regions 18. The light exposure regions 16 correspond to contact holes in a semiconductor wafer whereas the light shield regions 18 correspond to portions of the semiconductor wafer between adjacent contact holes. In the illustrated case, the matrix array has alternating columns: one including only light shield regions; and the other including light shield regions and light exposure regions arranged in an alternating manner. In other words, the matrix array have light shield region columns and mixed region columns arranged in an alternating manner.

The phase shift mask 20 also includes square patterns 14 of a first phase shift film and square patterns 17 of a second phase shift film to define the light shield regions 18. The first and second phase shift films exhibits a phase shift from each other.

In each light shield region 18, one pattern 14 and one pattern 17 are arranged in such a manner that they form a double box structure including two concentric boxes respectively consisting of those patterns. On each light shield region column, light shield regions each having an inner box consisting of the pattern 14 and an outer box consisting of the pattern 17 and light shield regions each having an inner box consisting of the pattern 17 and an outer box consisting of the pattern 14 are arranged in an alternating manner. Accordingly, adjacent patterns on each light shield region column exhibit a phase shift from each other, respectively.

The phase shift mask also includes square patterns 13 of the first phase shift film and square patterns 15 of the second phase shift film respectively formed on portions of the transparent substrate 11 corresponding to the light exposure regions 16. The patterns 13 are arranged on one of neighboring mixed region columns whereas the patterns 15 are arranged on the other mixed region column.

In accordance with the present invention, the arrangement of patterns 13, 14, 15 and 17 in the matrix array is also carried out in such a manner that those of different phases are arranged adjacent to each other.

Figure 4:
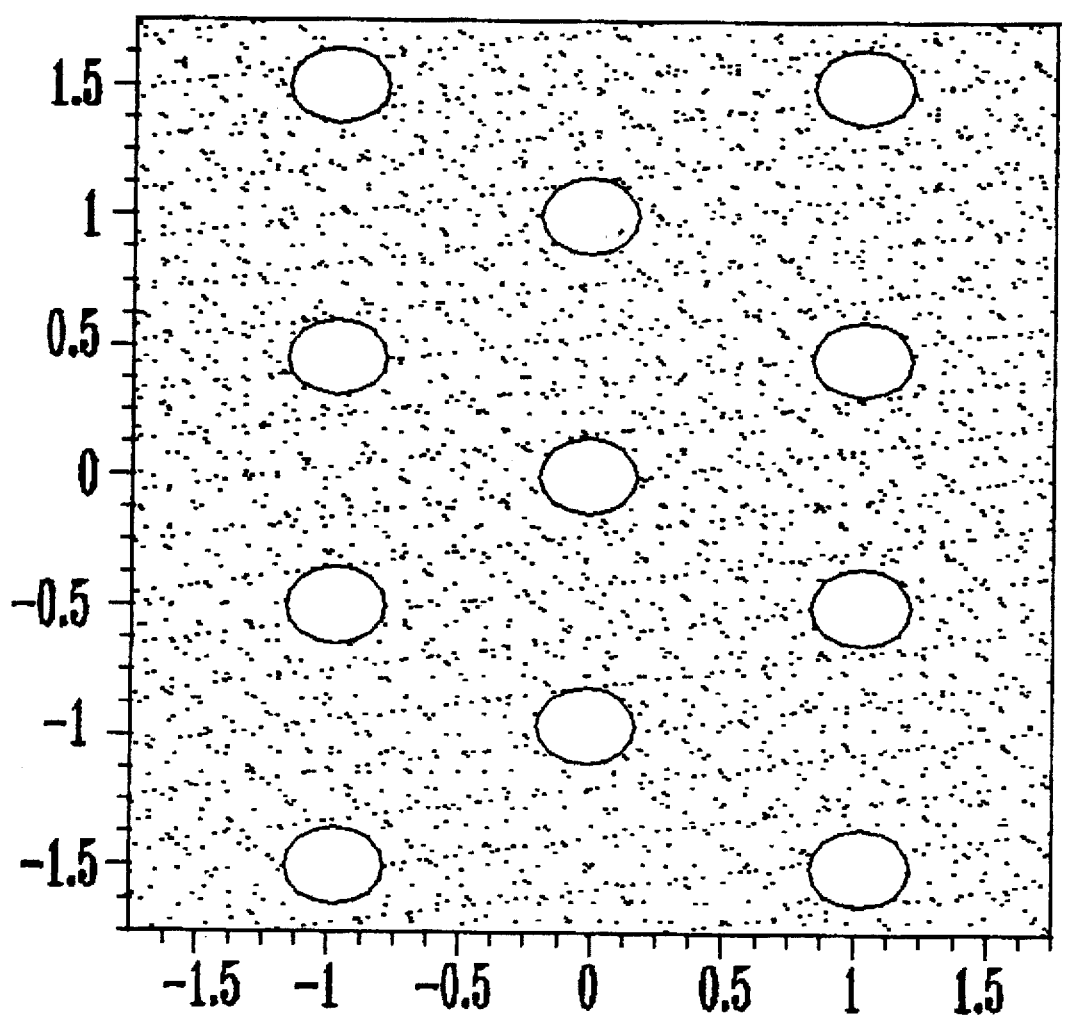
FIG. 4 is a diagram of a light contrast distribution obtained in the light exposure using the phase shift mask of FIG. 3.

Using the phase shift mask 20 having the above-mentioned structure, a light contrast as shown in FIG. 4 is obtained.

Although the patterns have been described as being comprised of the first and second phase shift films, they may be comprised of the transparent substrate itself and a 180° phase shift film.

Figure 5:
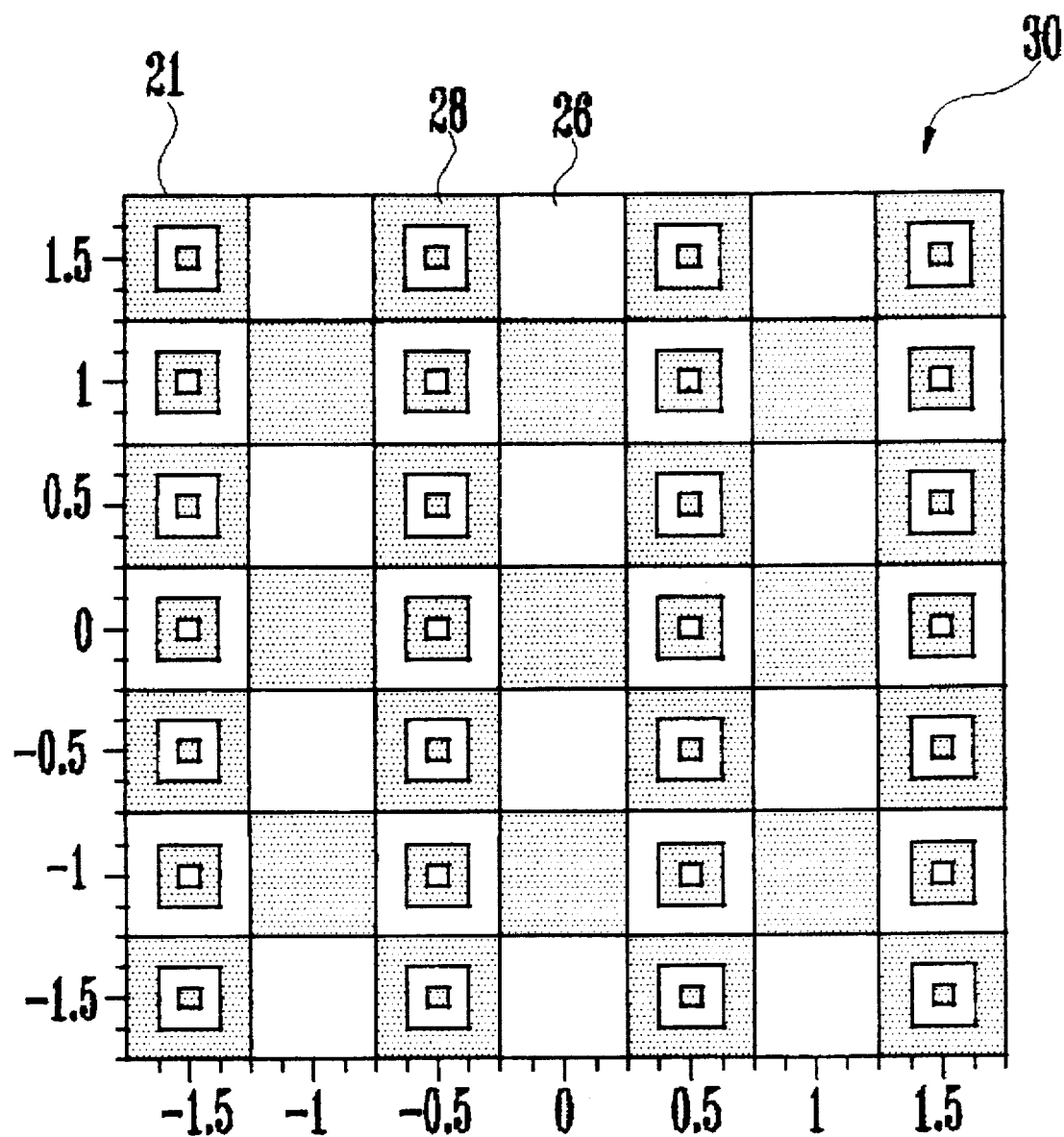
FIG. 5 is a plan view illustrating a phase shift mask according to a third embodiment of the present invention, which is adapted to form contact holes for charge storage electrodes.
Figure 6:
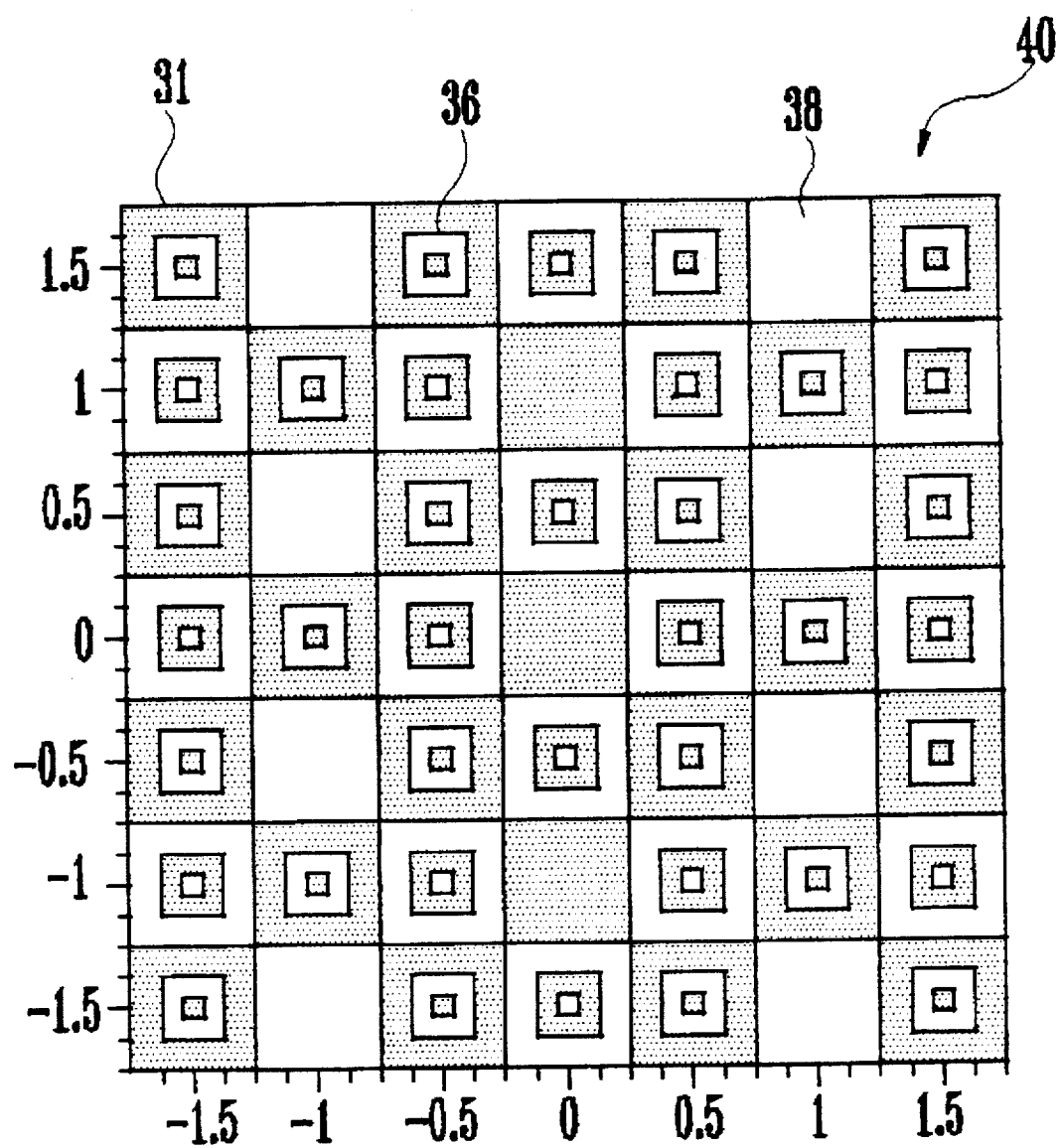
FIG. 6 is a plan view illustrating a phase shift mask according to a fourth embodiment of the present invention, which is adapted to form contacts for bit lines.

The light shield regions may have a triple box structure instead of the double box structure. In this case, a phase shift mask 30 shown in FIG. 5 may be used in the formation of contacts for charge storage electrodes. The phase shift mask 30 includes light exposure regions 36 and light shield regions 38 arranged as shown in FIG. 5. In the formation of contacts for bit lines, a phase shift mask 40 shown in FIG. 6 may be used. The phase shift mask 40 includes light exposure regions 36 and light shield regions 38 arranged as shown in FIG. 6.

As is apparent from the above description, the phase shift mask according to the present invention provides various effects.

For example, the phase shift mask of the present invention can form micro contacts having a dimension approximate to the wavelength of light used in the stepper. Accordingly, it is possible to reduce the interval between adjacent contacts. By virtue of such a reduction in contact interval, the phase shift mask of the present invention can be effectively used in the fabrication of highly integrated semiconductor devices.

Furthermore, the phase shift mask of the present invention provides an increased process margin in the formation of contacts. Accordingly, it is possible to achieve an improvement in process yield and operation reliability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A phase shift mask comprising:

a transparent substrate;

a plurality of light exposure regions respectively defined by patterns formed on portions of the transparent substrate corresponding to contact holes which will be formed using the phase shift mask, the patterns including those comprised of a first phase shift film and those comprised of a second phase shift film exhibiting a difference in phase from the first phase shift film;

a plurality of light shield regions respectively defined by patterns formed on portions of the transparent substrate not covered with the patterns defining the light exposure regions, the patterns of the light shield regions including those comprised of the first phase shift film and those comprised of the second phase shift film while the light shield regions each having a multiple box structure including at least two concentric boxes respectively consisting of the patterns of the first and second phase shift films associated with the light shield region; and the patterns of the first and second phase shift films defining the light exposure regions and light shield regions being arranged in such a manner that adjacent patterns are different in phase from each other.

2. A phase shift mask comprising:

a transparent substrate;

a plurality of light exposure regions respectively defined by patterns formed on portions of the transparent substrate corresponding to contact holes which will be formed using the phase shift mask, the patterns including those comprised of a first phase shift film and those comprised of a second phase shift film exhibiting a difference in phase from the first phase shift film;

a plurality of light shield regions respectively defined by patterns formed on portions of the transparent substrate not covered with the patterns defining the light exposure regions, the patterns of the light shield regions including those comprised of the first phase shift film and those comprised of the second phase shift film while the light shield regions each having a double box structure including an inner box and an outer box respectively consisting of the patterns of the first and second phase shift films associated with the light shield region; and the patterns of the first and second phase shift films defining the light exposure regions and light shield regions being arranged in such a manner that adjacent patterns are different in phase from each other.

3. The phase shift mask in accordance with claim 2, wherein the light exposure regions have a dimension larger than the wavelength of light as used whereas the dimension of the smaller box of each light shield region and the distance between the smaller and larger boxes of each light shield region are smaller than the wavelength of the light.

4. The phase shift mask in accordance with claim 2, wherein the smaller box of each light shield region has a size of about $0.2 \times 0.2$ $\mu m^2$ when i-line light is used while the intervals of the contact holes in lateral and longitudinal directions are about 1 $\mu m$ and about 0.5 $\mu m$, respectively.

5. The phase shift mask in accordance with claim 2, wherein the smaller box of each light shield region has a size of about $0.3 \times 0.3$ $\mu m^2$ when i-line light is used while the intervals of the contact holes in lateral and longitudinal directions are about 1.2 $\mu m$ and about 0.6 $\mu m$, respectively.

6. The phase shift mask in accordance with claim 2, wherein the first and second phase shift films are comprised of an oxide film.

7. The phase shift mask in accordance with claim 2, wherein the first and second phase shift films are comprised of a nitride film.

8. The phase shift mask in accordance with claim 2, wherein the first and second phase shift films are comprised of a spin-on-glass film.

9. The phase shift mask in accordance with claim 2, wherein one of the first and second phase shift films is comprised of the transparent substrate itself whereas the other phase shift film is made of a phase shift material.

10. The phase shift mask in accordance with claim 2, wherein one of the first and second phase shift films is formed by etching the transparent substrate in such a manner the etched portion of the transparent substrate exhibits a phase shift of about 180° from the other phase shift film.

11. A phase shift mask comprising:

a transparent substrate;

a plurality of light exposure regions respectively defined by patterns formed on portions of the transparent substrate corresponding to contact holes which will be formed using the phase shift mask, the patterns including those comprised of a first phase shift film and those comprised of a second phase shift film exhibiting a difference in phase from the first phase shift film;

a plurality of light shield regions respectively defined by patterns formed on portions of the transparent substrate not covered with the patterns defining the light exposure regions, the patterns of the light shield regions including those comprised of the first phase shift film and those comprised of the second phase shift film while the light shield regions each having a triple box structure including three concentric boxes respectively consisting of the patterns of the first and second phase shift films associated with the light shield region and arranged in an alternating manner; and the patterns of the first and second phase shift films defining the light exposure regions and light shield regions being arranged in such a manner that adjacent patterns are different in phase from each other.

12. The phase shift mask in accordance with claim 11, wherein the light exposure regions have a dimension larger than the wavelength of light as used whereas the dimension of the smallest box of each light shield region and the distance between the smallest and largest boxes of each light shield region are smaller than the wavelength of the light.

13. The phase shift mask in accordance with claim 11, wherein the smallest box of each light shield region has a size of about $0.2 \times 0.2$ $\mu m^2$ when i-line light is used while the intervals of the contact holes in lateral and longitudinal directions are about 1 $\mu m$ and about 0.5 $\mu m$, respectively.

14. The phase shift mask in accordance with claim 11, wherein the smallest box of each light shield region has a size of about $0.3 \times 0.3$ $\mu m^2$ when i-line light is used while the intervals of the contact holes in lateral and longitudinal directions are about 1.2 $\mu m$ and about 0.6 $\mu m$, respectively.

15. The phase shift mask in accordance with claim 11, wherein the first and second phase shift films are comprised of an oxide film.

16. The phase shift mask in accordance with claim 11, wherein the first and second phase shift films are comprised of a nitride film.

17. The phase shift mask in accordance with claim 11, wherein the first and second phase shift films are comprised of a spin-on-glass film.

18. The phase shift mask in accordance with claim 11, wherein one of the first and second phase shift films is comprised of the transparent substrate itself whereas the other phase shift film is made of a phase shift material.

19. The phase shift mask in accordance with claim 11, wherein one of the first and second phase shift films is formed by etching the transparent substrate in such a manner the etched portion of the transparent substrate exhibits a phase shift of about 180° from the other phase shift film.

* * * * *